(12) United States Patent
Van Groos et al.

(10) Patent No.: US 7,123,349 B2
(45) Date of Patent: Oct. 17, 2006

(54) LITHOGRAPHIC PROJECTION ASSEMBLY, SUBSTRATE HANDLING APPARATUS AND SUBSTRATE HANDLING METHOD

(75) Inventors: Pieter Johannes Marius Van Groos, Geldrop (NL); Pieter Renaat Maria Hennus, Peer (BE); Jan Frederik Hoogkamp, Breda (NL); Albert Jan Hendrik Klomp, Eindhoven (NL); Johannes Onvlee, 's-Hertogenbosch (NL); Raimond Visser, Best (NL)

(73) Assignee: ASML Netherlands B.V., Veldhoven (NL)

( * ) Notice: Subject to any disclaimer, the term of this patent is extended or adjusted under 35 U.S.C. 154(b) by 125 days.

(21) Appl. No.: 10/797,657

(22) Filed: Mar. 11, 2004

(65) Prior Publication Data
US 2004/0218168 A1 Nov. 4, 2004

(30) Foreign Application Priority Data
Mar. 11, 2003 (EP) .................................. 03075702

(51) Int. Cl.
G03B 27/58 (2006.01)
G03B 27/42 (2006.01)
(52) U.S. Cl. .......................................... 355/72; 355/53
(58) Field of Classification Search ................ 355/53, 355/72
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,486,080 A | 1/1996 | Sieradzki | |
| 5,523,193 A | 6/1996 | Nelson | |
| 5,730,573 A | 3/1998 | Masujima et al. | |
| 5,969,441 A | 10/1999 | Loopstra et al. | |
| 6,281,510 B1 | 8/2001 | Yoshitake et al. | |
| 6,315,512 B1 | 11/2001 | Tabrizi et al. | |
| 6,382,895 B1 | 5/2002 | Konishi et al. | |
| 6,906,783 B1 | 6/2005 | del Puerto et al. | |
| 2002/0002946 A1 | 1/2002 | Tanaka et al. | |
| 2002/0024645 A1 | 2/2002 | Nakano | |
| 2004/0263823 A1 | 2/2002 | Klomp et al. | |
| 2003/0082030 A1 | 5/2003 | Del Puerto et al. | |
| 2005/0054217 A1 | 3/2005 | Klomp et al. | |

FOREIGN PATENT DOCUMENTS

| | | |
|---|---|---|
| EP | 1 282 157 A1 | 2/2003 |
| EP | 1 341 042 A2 | 9/2003 |
| WO | WO 98/33096 | 7/1998 |
| WO | WO 98/38597 | 9/1998 |
| WO | WO 98/40791 | 9/1998 |

OTHER PUBLICATIONS

European Search Report in reference to EP 03 07 5702 dated Feb. 4, 2004.
European Search Report issued in EP 04 07 7586 dated Jan. 4, 2005.
Korean Office Action dated Feb. 14, 2006.

Primary Examiner—Peter B. Kim
(74) Attorney, Agent, or Firm—Pillsbury Winthrop Shaw Pittman LLP

(57) ABSTRACT

The invention relates to a lithographic projection assembly, having at least two load locks for transferring substrates between a first environment and a lower pressure second environment, a substrate handler with a handler chamber within the second environment and a lithographic projection apparatus including a projection chamber. The handler chamber and the projection chamber communicate via a load position for entering a substrate from the handler chanter into the projection chamber and an unload position for removing the substrate from the projection chamber into the handler chamber. The handler chamber also includes pre-processing means for pre-processing of the substrates and transport means for transferring substrates between the load locks and pre-processing means.

18 Claims, 3 Drawing Sheets

LITHOGRAPHIC PROJECTION ASSEMBLY, SUBSTRATE HANDLING APPARATUS AND SUBSTRATE HANDLING METHOD

PRIORITY INFORMATION

This application claims priority from European Patent Application No. 03075702.5, filed Mar. 11, 2003, herein incorporated by reference in its entirety.

BACKGROUND OF THE INVENTION

1. Field of the Invention

The present invention relates to a lithographic apparatus, and in particular, to a lithographic projection assembly comprising a substrate handler and an associated substrate handling method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

a programmable mirror array: one example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth here above.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In a typical lithography arrangement, substrates are transported to the substrate table of a lithographic projection apparatus via a substrate track and a substrate handler. In the substrate track the surface of the substrate is pre-treated. The pre-treatment of the substrate typically includes at least partially covering the substrate by a layer of radiation-sensitive material (resist). Further, prior to the imaging step, the substrate may undergo various other pre-treatment procedures, such as priming, and soft bake. After the pre-treatment of the substrate the substrate is transported from the substrate track to the substrate stage via the substrate handler.

The substrate handler typically is adapted to accurately position the substrate on the substrate table and may also control the temperature of the substrate.

For a certain lithographic projection apparatus, such as an apparatus using Extreme Ultra-Violet radiation (in short EUV-radiation), the projection onto a substrate should operate under a vacuum. Therefore the substrate handler should be adapted to transfer the pre-treated substrate into a vacuum. That typically means that at least after the pre-treatment of the substrate in the substrate track, the handling and the temperature control of the substrate has to be accomplished in a vacuum.

For another type of lithographic projection apparatus, such as an apparatus operated in a $N_2$ environment using 157 nm radiation, a specific gas environment, such as a $N_2$-environment, should be maintained. Therefore the substrate handler should be adapted to transfer the pre-treated substrate into a specific gas environment. That typically means that at least after the pre-treatment of the substrate in the substrate track, the handling and the temperature control of the substrate has to be accomplished in a specific gas environment.

SUMMARY OF THE INVENTION

The principles of the present invention, as embodied and broadly described herein, provide for a lithographic projection assembly having a lay out which enables the use of a limited amount of transporting means in order to effectively transfer substrates between a first environment, such as the substrate track, and the projection chamber, which in general contains the substrate stage. The lithographic projection assembly comprises a radiation system for providing a projection beam of radiation, a support structure for supporting a patterning device that configures the projection beam according to a desired pattern, a substrate holder for holding a substrate, at least two load locks for transferring the substrate between a first environment and a second environment, the second environment configured to have a lower pressure than the first environment, and a lithographic projection apparatus comprising a projection chamber in which the substrate is processed by projecting the patterned beam onto a target portion of the substrate, and an actuator mechanism a coil arrangement in thermal contact with at least one cooling element, wherein the coil arrangement includes one or more slits in order to increase the electrical resistance of eddy current paths. The assembly further comprises a substrate handler comprising a handler chamber in which the second environment prevails, the handler chamber and the projection chamber communicate via a load position for inputting the substrate from the handler chamber into the projection chamber and an unload position for removing the substrate from the projection chamber into the handler chamber, the handler chamber comprising a pre-processing system configured to perform pre-processing tasks on the substrate prior to being processed in the projection chamber and a transport system configured to transfer the substrate from the load locks to the pre-processing system, transfer the substrate from the pre-processing system to the load position, and transfer the substrate from the unload position to the load locks.

The load locks enable entering substrates from a first environment, for example, under atmospheric conditions, to a second environment having a lower pressure than the first environment, the second environment being for example a vacuum, or near vacuum. The second environment prevails in a handler chamber. The handler chamber comprises transport means for transferring substrates from the load locks to the projection chamber and vice versa. The handler chamber also comprises pre-processing means, such as pre-alignment means for accurately positioning the substrate—so that later on in the projection chamber the substrate can be processed with extreme accuracy—, and/or thermal treatment means for thermal treatment of the substrate to bring it to a predetermined temperature and/or to equalize the temperature across the substrate and/or conditioning the temperature of the substrate. The pre-alignment means in general contain means for determining and/or correcting the position of the substrate with respect to a certain reference point. By providing at least two load locks, the throughput of substrates to be processed in the projection apparatus as well as of substrates processed in the projection apparatus is increased, which in turn necessarily increases the number of transport means, such as the number of robots, or increases the handling speed of the transport means.

According to an embodiment, the projection chamber is a vacuum chamber and the lithographic projection apparatus comprises vacuum means to establish or maintain vacuum in the vacuum chamber. Such a lithographic projection assembly is particularly adapted for using EUV-radiation, which requires processing the substrates under vacuum. By vacuum is understood an absolute pressure lower than 0.1 bar.

According to an embodiment the transport system comprises a single, especially only one, manipulator provided with a gripper and the lithographic projection assembly comprises control means adapted to control the manipulator for picking a substrate from one of the load locks and transferring said substrate to the pre-processing means; picking a substrate from the pre-processing means and transferring said substrate to the load position; and picking a substrate from the unload position and transferring said substrate to one of the load locks.

This embodiment enables the use of a minimal number of manipulators, which in turn saves space and costs.

According to a further embodiment, the lithographic projection assembly is characterised in that the transport system comprises a first manipulator provided with a first gripper, and a second manipulator provided with a second gripper, and in that the lithographic projection assembly comprises control means adapted to control the first and second manipulator for: picking a substrate, with the first gripper, from one of the load locks and transferring said substrate to the pre-processing means; picking a substrate, with the second gripper, from the pre-processing means and transferring said substrate to the load position; picking a substrate, with the first gripper, from the unload position and transferring said substrate to one of the load locks.

By providing a first and a second manipulator and accordingly adapted control means it is achieved that the second gripper only transfers substrates to be processed into the projection chamber. This means that after pre-processing at the pre-processing means, the substrate is dealt with by a second gripper, which works very accurately, whilst the first gripper can be allowed to work less accurate, which in turn puts lower demands on the first gripper and manipulator.

Optionally, the pre-processing means can comprise pre-aligning means pre-aligning the substrate for improving the positional accuracy of the substrate. The first gripper only transfers processed substrates towards the load locks as well as substrates to be processed away from the load locks. Thus, by using one manipulator for the transfer of substrates towards and away from the load locks, a space saving configuration is achieved in a zone with busy substrate traffic. Further, by using a second manipulator for delivering substrates into the projection chamber and by using a first manipulator for removing substrates from the projection chamber, the exchange rate of substrates between the projection chamber and handler chamber is increased.

In order to increase the throughput, it is according to an embodiment of the invention advantageous when the first and/or second gripper is provided with thermal treatment means for bringing the substrate to a predetermined temperature and/or equalising the temperature across the substrate, and/or conditioning the temperature of the substrate. By this the time used for transfer of substrates is simultaneously used for thermal treatment of the substrates. Conditioning of the temperature of the substrate will minimise disturbance of said substrate temperature.

In order to minimise the number of manipulators needed, it is according to an embodiment of the invention advantageous when the at least two load locks comprise a first and a second load lock, the single manipulator or the first manipulator is positioned in order to co-operate with both said first and said second load locks. Thus, from the side of the substrate handler, both the load locks are served with one and the same manipulator. Further this configuration increases the throughput of substrates. While the manipulator serving the load locks is used in order to position a substrate inside a first load lock or to retrieve a substrate from the first load lock, the second load lock can simultaneously be used for transferring a substrate between the first environment and the second environment.

According to a further embodiment the at least one load lock, such as the first and/or second load locks, are provided with first and second substrate support positions. This increases the flexibility of the use of the at least one load lock. For example, when a load lock presents a substrate to be processed to the substrate handler, the manipulator can first deliver a processed substrate on a free support position in the load lock and then take away the presented substrate to be processed. This reduces the number of movements to be made by a manipulator.

According to a further embodiment, the first and second load locks are connected to a substrate track for supply and removal of substrates to and from the first and second load locks.

According to a further embodiment, the lithographic projection assembly further comprises a third load lock for transferring objects, such as substrates, from a third environment to a second environment, the third load lock being, at the side facing the third environment, freely accessible. Such freely accessible third load lock enables on the one hand to introduce into the lithographic projection assembly special objects, such as replacement parts, tools, etcetera, which need to be introduced into the lithographic projection assembly for some reason. By doing this via a third load lock, one can maintain the vacuum or near vacuum condition in the handler chamber and/or projection chamber. In order to be able to use the third load lock as a temporary buffer or storage place, it is according to an embodiment of the invention advantageous when the control means is adapted for placing a substrate with said transport means into the third load lock, for keeping an external door of the third load lock closed while said placed substrate is in the third load lock, and picking and transfer said placed substrate with: the same transport means gripper after having transferred other substrates with said transport means.

In order to increase the flexibility of the lithographic projection assembly according to an embodiment of the invention, it is advantageous when the control means is adapted to control the load locks independently of each other. This means that the load locks are not coupled in phase relative to each other, unless the control means impose a certain phase difference onto the load locks. In fact the load locks can be event driven, and the events are under control of the control means.

According to a further embodiment of the invention, one or more of the at least two load locks comprises an additional door for transferring objects, such as substrates, from a fourth environment to the second environment, the additional door facing the fourth environment and being freely accessible. Such freely accessible additional door enables to introduce into the lithographic projection assembly special objects, such as replacement parts, tools, etcetera, which need to be introduced into the lithographic projection assembly for some reason. By doing this via an additional door, one can maintain the second environment vacuum in the handler chamber and/or projection chamber while the station at the first environment side of the load lock can stay where it is without being decoupled from the load lock. Here, freely accessible means accessible by an operator without removing a large portion of hardware, the load lock or its additional door as such can optionally be sealed by a cover.

According to a further embodiment, the pre-processing means comprise thermal treatment means for bringing the substrate to a predetermined temperature and/or equalising the temperature across the substrate. By providing the pre-processing means with thermal treatment means, one is able to dispense with thermal treatment in the load locks or to allow only a moderate thermal treatment in the load locks. By this the throughput of the load locks can be increased, which throughput is one of the determining factors in the overall throughput of the lithographic projection assembly as a whole. Further advantage, when the pre-processing means also comprise pre-alignment means, since pre-alignment tasks can take a relatively large amount of time, a combination of thermal treatment means with pre-alignment means, result in effective simultaneous thermal treatment with pre-aligning.

According to a further embodiment, the substrates are semi-conductor wafers.

According to a sub-aspect of the present aspect of the invention, the invention also relates to a handling apparatus for handling substrates, comprising the assembly according to the invention, however without the projection apparatus. Such handling apparatus, called a substrate handler assembly, can more clearly be defined as comprising: at least two load locks for transferring substrates from a first environment to a second environment, the second environment having a lower pressure than the first environment; a substrate handler comprising a handler chamber in which the second environment prevails; the handler chamber communicating via, on the one hand, a load position for entering a substrate from the handler chamber into a next station and, on the other hand, an unload position for moving a substrate from the next station into the handler chamber; the handler chamber being provided with: pre-processing means for treating of the substrates; and transport means adapted for transferring substrates from the load locks to the pre-processing means and from the pre-processing means to the load position as well as for transferring substrates from the unload position to the load locks.

For the handling apparatus as well as the substrate handler assembly as the lithographic projection assembly according to the invention, it is advantageous when it further comprises a track, in which the at least two load locks are arranged between the track and the substrate handler.

According to a sub-aspect of the present aspect of the invention, there is also provided a method for handling a substrate comprising transferring a substrate from a first environment into one of at least two load locks through an external door of said load lock, closing said external door and evacuating said one load lock, opening an internal door of said load lock, picking the substrate from said load lock with a first manipulator and transferring the substrate with said first manipulator to a pre-processing means, treating the substrate with the pre-processing means, picking the substrate from the pre-processing means with said first manipulator or a second manipulator, transferring the substrate picked from the pre-processing means with said first or second manipulator to a load position, treating the substrate and delivering the substrate to an unload position, picking the substrate from the unload position with said first manipulator and transferring the substrate through the internal door into said load lock or an internal door into another load lock, closing the respective internal door and venting the respective load lock, and opening said respective load lock and removing the substrate from said respective load lock.

This method can be carried out time efficiently with a minimum of manipulators.

Further advantages will be clear from the preceding part of the disclosure.

In order to bring the substrate to be processed in the projection chamber to a certain temperature, it is advantageous to thermally treat the substrate, before step c), during and/or after the evacuating step of step b). By this one can, for example, make use of the time needed for evacuating to subject the substrate to at least a part of the thermal treatment it needs to undergo.

According to a further embodiment, the substrate can be thermally treated when the substrate is at the pre-processing means. By this one can advantageously make use of the time needed for pre-alignment—which time is relatively long—for subjecting the substrate to a part or all of the thermal treatment required.

To increase the exchange rate between the first environment and the second environment it is according to an embodiment of the invention advantageous, when step d) is carried out with respect to one load lock, while steps a) and/or b) and/or c) and/or j) and/or k) are, at the same time, being carried out in another load lock.

According to a further embodiment the substrate is a semiconductor wafer.

According to a further sub-aspect of this aspect, the invention provides a method of operating a lithographic projection assembly according to this first aspect of the invention, comprising a startup mode, a normal operation mode and a run empty mode, the at least two load locks each having a pump down cycle in which the pressure in the respective load lock is reduced as well as a vent cycle in which the pressure in the respective load lock is increased, wherein, in the startup mode, at least one of said at least two load locks performs the vent cycle without a substrate being present in the respective load lock, whilst the respective load lock performs the pump down cycle with a substrate being present in the respective load lock; wherein, in the normal operation mode, at least one of said at least two load locks performs the pump down cycle as well as the vent cycle with a substrate being present in the respective load lock; wherein, in the run empty mode, at least one of said at least two load locks performs the pump down cycle without a substrate being present in the respective load lock, whilst the respective load lock performs the vent cycle with a substrate being present in the respective load lock.

This method makes time efficiently use of the at least two load locks—or alternatively of the at least one load lock (see remark in this respect some paragraphs below)—and transport means for operating, for example, for several days continuously, the lithographic projection assembly according to the invention at a relatively large throughput. In case of, for example, stagnation of substrates in the lithographic projection apparatus occurs or in the feed of substrates to be processed to the load locks, the control means will switch from the normal operation mode to the run empty mode.

Depending on the circumstances this run empty mode can be operated for a longer time or for a very short time, such as only one venting cycle of one load lock. When the stagnation is solved, the control means can, depending on the circumstances, switch directly to the normal operation mode or to the startup mode, likely later on followed by a switch to the normal operation mode, although a switch back to the run empty mode is also possible, depending on the circumstances. The startup mode and the run empty mode thus do not only occur at a start of a substrate production or at the en of a substrate production, but also during the production. Thus according to a preferred embodiment one or more of the startup mode, the normal operation mode and the run empty mode are repeated in arbitrary order depending on events occurring during the processing of substrates in the lithographic projection assembly.

High efficiency is obtained according to this method of the invention when in case of only one single load lock, this load lock is provided with a first and second substrate support position. Of course, this also applies for more than one load lock, which will advantageously all, or only some, be provided with a first and second substrate support position. However, in case of two or more load locks, the efficiency will also be high in case all load locks or some of the load locks will have only one substrate support position.

The lithographic projection assembly according to this first aspect of the invention can also operate with only one load lock, i.e. in the claims the phrase 'at least two load locks' can be replaced by 'at least one load lock'. Some of the advantages of 'at least two load locks' will be lost by this replacement, however many of the other advantages apply also in case of 'one load lock'.

Further, it is to be understood that in accordance with the present invention, a manipulator, such as the single manipulator and/or the first manipulator and/or the second manipulator, can be provided with only one gripper (which is preferred) as well as with two or more grippers.

Regarding the "load lock" feature, a load lock is an apparatus for transferring objects, such as substrates, from a first environment to a second environment, one of the environments having a lower pressure than the other environment. According to the prior art, a load lock is provided with a single support position. This support position is used for transferring an object coming from the first environment for transfer to the second environment, as well as for transferring an object coming from the second environment for transfer to the first environment.

During the transfer of an object from the first environment to the second environment the interior of the load lock is evacuated. The evacuation will take a certain amount of time. In order to increase the number of objects to be transferred from the first environment to the second environment, it is possible to increase the speed of the evacuation process. However, the evacuation of a load lock according to the prior art still will require a minimum amount of time.

An object of this aspect of the present invention is to improve the throughput of a lithographic projection assembly, wherein the space needed to accommodate the components of the lithographic projection assembly is relatively small.

This and other objects are achieved according to this aspect of the present invention by providing a lithographic projection assembly, comprising: at least one load lock for transferring objects, such as substrates, between a first environment and a second environment, the second environment having a lower pressure than the first environment; an object handler comprising a handler chamber in which the second environment prevails; a lithographic projection apparatus comprising a projection chamber; wherein the handler chamber and projection chamber communicate for exchange of objects; wherein the load lock comprises: a load lock chamber; evacuation means for evacuating the load lock chamber; door means for closing the load lock chamber during evacuation and for opening the load lock chamber to enter an object in or remove an object from the load lock chamber; wherein the load lock chamber is provided with at least two object support positions.

An advantage of the presence of at least two object support positions, such as a first and a second support position, within the load lock, is that in a load lock cycle a first object can be positioned on one object support position and a second object can be removed from another object support position. For example, when opening the load lock for connecting the interior of the load lock chamber with the second environment, it is possible to first position a processed substrate on an object support position and thereafter to remove a to be processed object already positioned on another object support position. Subsequently, after closing, and venting the load lock chamber towards the first environment, its interior can be connected with the first environment and the processed object can be removed and a new to be processed object can be inserted. The load lock can then be evacuated and the preceding procedure can be repeated etc. This procedure enables a time-efficient transfer of objects, such as substrates, between the first and second environment. Moreover the time necessary for moving the equipment, such as a manipulator, for example a robot arm, for gripping and manipulating the objects, such as substrates, to be transferred between the first environment and the second environment can be kept to a minimum.

When evacuating the interior of a load lock, the pressure difference will influence the temperature inside the load lock chamber. By this also the temperature of the object, such as a substrate, in the load lock chamber will be influenced. With respect to objects to be processed in a lithographic projection assembly, the temperature of the object is one of the factors which need to be under control. This especially applies when the substrate is in the lithographic projection apparatus itself, however, this also means that in the transfer process towards the lithographic projection apparatus attention to the temperature of the substrate should be given.

In order to improve temperature control of an object during the transfer thereof through the load lock, it is according to an embodiment the present invention provided that the load lock comprises volume decreasing means for decreasing the gas volume adjacent the surface of an object positioned on at least one of the object support positions. Because of this measure, the volume of gas adjacent the surface of an object will be minimal. That means that the temperature difference caused by pressure differences during the transfer of the object will be kept to a minimum.

According to an embodiment of this aspect of the invention, the at least one object support position comprises a support plate of a size about equal to or larger than the object to be supported; a ceiling plate is provided above said at least one object support position, the ceiling plate having a size of about equal to or larger than the object; and the volume decreasing means comprises lifting means for: decreasing the distance between the support plate and the ceiling plate of the at least one object support position prior to and/or during evacuation of the load lock chamber; and increasing the distance between the support plate and the ceiling plate prior to an object removal from or delivery to the at least one object support position.

The support plate of a size about equal to or larger than the object to be supported means that in case of a substrate, the supported side of the substrate is prevented from contact with the gas volume adjacent to the substrate or, when the support plate is a pimpled plate -known as such from the prior art-, the supported side has a limited contact with the gas volume present between the supported side of the substrate, the support plate and the pimples of the support plate. The ceiling plate, which can be a separate plate element arranged in the load lock chamber as well as a wall of the load lock chamber or a flat surface of any element present in the load lock chamber, also is required to have a size of about equal to or larger than the substrate in order to be able to minimise the gas volume adjacent to the upper surface of the substrate.

According to a further embodiment of this aspect of the invention, the position of means is adapted to act on the support plate, while the corresponding ceiling plate is preferably arranged in a stationary manner in the load lock chamber. This arrangement provides advantages in reducing the time needed for handling over a substrate from a gripper to a substrate support position, or vice versa a substrate from a substrate support position to a gripper.

According to a further embodiment of this aspect of the invention, the positioning means are provided at the sides of the load lock chamber and/or the top of the load lock chamber and/or the bottom of the load lock chamber. This arrangement allows free entry of the load lock chamber from the front side as well as from the back side.

In order to compensate for temperature influences acting on the object during transfer through the load lock chamber and/or to subject the object in an early stage to a temperature treatment, according to an embodiment of the invention, the load lock, preferably one or more of the at least two support positions of the load lock, comprises thermal treatment means for bringing an object to a predetermined temperature and/or equalising the temperature across the object.

In this respect, according to an embodiment of the invention, a support plate of one or more of the at least two support positions may be provided with thermal treatment means. Such thermal treatment means can, for example, be in the form of lines, such as tubes or channels, provided in the interior of the respective support plate, through which lines a fluid is pumped in order to control the temperature of the support plate and, via the support plate, of the object.

According to a further embodiment of this aspect of the invention, two of said at least two support positions are placed one above the other. In this situation it is advantageous that thermal treatment means is positioned between said two support positions. At thermal treatment means can, for example, be a plate with internal lines through which a fluid is pumped, as explained before The advantage of this configuration is that one saves space as well as components by providing a thermal treatment means which can be used for thermal treatment of a support position above said thermal treatment means as well as a support position below said thermal means. In case one and the same load lock is used for transfer of objects to be treated in the lithographic projection apparatus as well as for objects processed in said lithographic projection apparatus, it is worthwhile to note that in general the thermal treatment is especially of importance for the objects still to be processed and of less importance, but depending on the after treatment procedures still of some importance, for already processed objects. This means that thermal treatment means arranged between two support positions is not required to be equally effective with respect to both support positions, at least assuming that one of the support positions is used for objects still to be processed and the other support position is used for objects already processed.

As already indicated it is, according to an embodiment of the invention, advantageous when the thermal treatment means comprises lines, such as tubes or channels, and a fluid pumping system for pumping fluid through said lines, the lines provided internally in a support plate and/or in one or more walls of the load lock chamber.

According to a further preferred embodiment of this aspect of the invention, the load lock chamber comprises a top wall and a bottom wall, wherein the evacuation means comprise an evacuation opening provided in the bottom wall of the load lock chamber, and wherein the load lock comprises a venting opening provided in the top wall of the load lock chamber. By evacuating from the bottom and venting from the top wall, the gas flow in the apparatus will be from top to bottom. This means that particles, if present, will be transported by the gas from the upper part of the load lock chamber to the bottom part. The particles will be deposited at the bottom of the load lock chamber or removed from the load lock chamber. In this respect it is preferred that the venting opening and evacuation opening are arranged centrally with respect to the support positions, and the support positions are arranged one above the other. This provides the possibility to use the gas flow created internally in the load lock chamber during evacuation and/or venting for removing particles which might lay on or might adhere to the substrate placed in the load lock chamber. The top wall and/or bottom wall can be fixed but need not be fixed, advantageously the top wall and/or bottom wall are removable for maintenance purposes.

According to a further embodiment of this aspect, the projection chamber is a vacuum chamber and the lithographic projection apparatus comprises vacuum means for establishing or maintaining a vacuum in the vacuum chamber. By vacuum is meant an absolute pressure of about 0.1 bar or less.

According to a further embodiment of this aspect of the invention, the projection apparatus comprises: a radiation system for providing a projection beam of radiation; a support structure for supporting patterning means, the patterning means serving to pattern the projection beam according to a desired pattern; a substrate table for holding a substrate; and a projection system for projecting the patterned beam onto a target portion of the substrate.

According to a further embodiment of this aspect of the invention, the objects are semiconductor wafers.

According to further embodiment of this aspect of the invention, the door means comprises a first door towards the first environment and a second door towards the second environment. Having two doors, each towards one of the environments, avoids that one has to manipulate the load lock chamber itself. The load lock chamber can be mounted in a fixed position. This increases the input speed of the load lock.

In order to increase the throughput of the lithographic projection assembly according to an embodiment of the invention, it is advantageous when the lithographic projection assembly comprises two or more of said load locks. The limiting factor in the throughput of the load locks is the time required for venting and evacuating. By having two or more load locks, one can present more objects in a time period to the second environment. For example one load lock can be opened towards the second environment, while the other load lock already contains an object which is to be transferred to the second environment afterwards.

According to this aspect of the invention, the invention also relates to a load lock as discussed above. Differently worded the invention thus also relates to a load lock for transferring objects, such as substrates, between a first environment and a second environment, the second environment having a lower pressure than the first environment; wherein the load lock comprises: a load lock chamber; evacuation means for evacuating the load lock chamber; door means for closing the load lock chamber during evacuation and for opening the load lock chamber to enter an object in or remove an object from the load lock chamber; wherein the load lock chamber is provided with at least two object support positions.

The dependent claims directed to a lithographic projection assembly can also be seen as claims depending on this load lock claim, forming preferred embodiments of the load lock.

According to this aspect of the invention, the invention also relates to an assembly of a load lock according to the invention and a wafer track system, wherein the door means facing the first environment debouches at the wafer track system.

According to this aspect, the present invention also relates to a method for transferring objects, such as substrates, between a first environment and a second environment, the method using a load lock, preferably a load lock as described above, the load lock having a load lock chamber, the method comprising: positioning a first object on a first object support position inside the load lock, closing the load lock in order to enclose the object, evacuating the load lock, by means of evacuation means, opening the load lock for connecting the load lock to the second environment, positioning a second object on a second object support position inside the load lock and removing the first object from the first object support position. The advantages of this method will be clear from the preceding description with respect to the lithographic projection assembly.

According to an embodiment of the method of this aspect of the invention, it is advantageous when the method subsequently comprises: closing the load lock in order to enclose the second object, venting the load lock, opening the load lock in order to connect the load lock to the first environment, and removing the second object from the load lock.

The throughput of the method according to an embodiment of the invention can be increased, when the positioning of the second object is performed before the removing of the first object, and when both said positioning and removing are performed with a same gripper.

For reasons explained before, the method according to an embodiment of the invention advantageously comprises decreasing the volume of gas adjacent the first object positioned on the first object support position, prior to evacuation of the load lock.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

As will have become clear, this invention comprises several aspects. Each aspect is isolated from the other aspects an invention, however one or more of the aspects, or parts of the aspects, can according to the invention advantageously be combined with each other.

BRIEF DESCRIPTION OF DRAWINGS

Embodiments of the invention will now be described, by way of example only, with reference to the accompanying schematic drawings in which corresponding reference symbols or numbers indicate corresponding parts, and in which.

In the following description like reference symbols or numbers refer to like parts throughout the drawings.

DETAILED DESCRIPTION

Lithographic Apparatus

Figure 1:
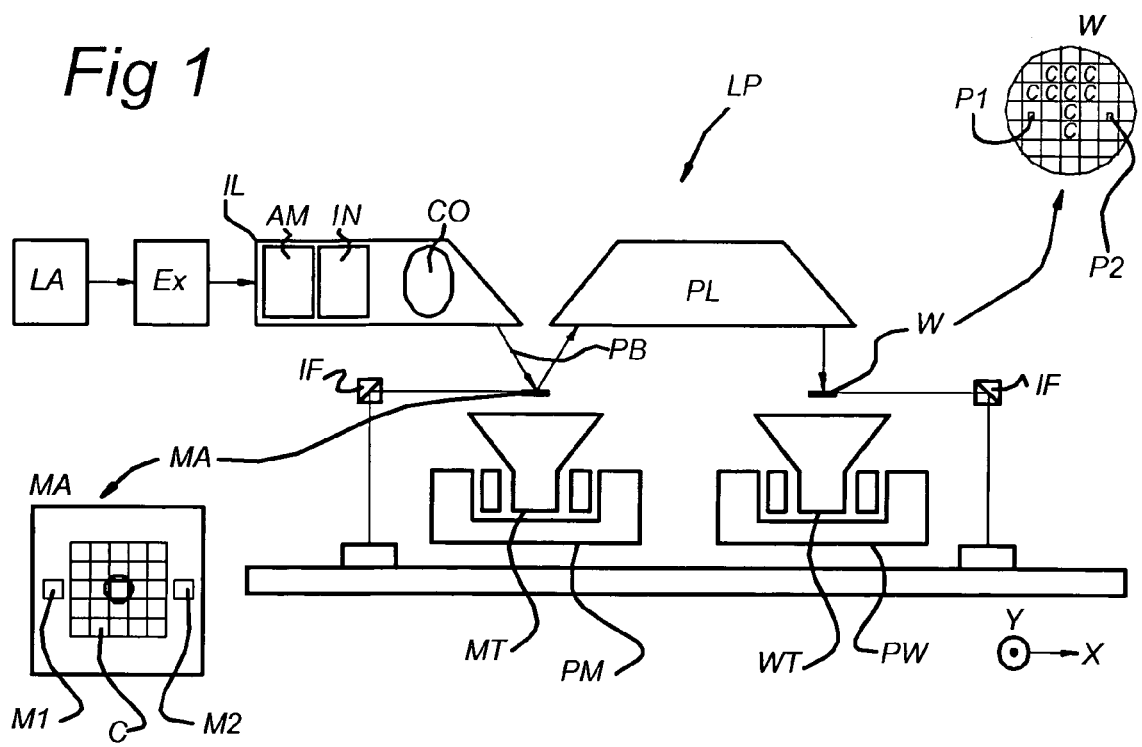
FIG. 1 schematically depicts a lithographic projection apparatus according to an embodiment of the invention.

FIG. 1 schematically depicts a lithographic apparatus according to a particular embodiment of the invention. The apparatus comprises:

- a radiation system Ex, IL: for supplying a projection beam PB of radiation (e.g. UV radiation). In this particular case, the radiation system also comprises a radiation source LA;
- a first object table (mask table) MT: provided with a mask holder for holding a mask MA (e.g. a reticle), and connected to first positioning mechanism PM for accurately positioning the mask with respect to item PL;
- a second object table (substrate table) WT: provided with a substrate holder for holding a substrate W (e.g. a resist-coated silicon wafer), and connected to second positioning mechanism PW for accurately positioning the substrate with respect to item PL; and
- a projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a mercury lamp or an excimer laser) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in a variety of different modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure;

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

EMBODIMENTS

Figure 2:
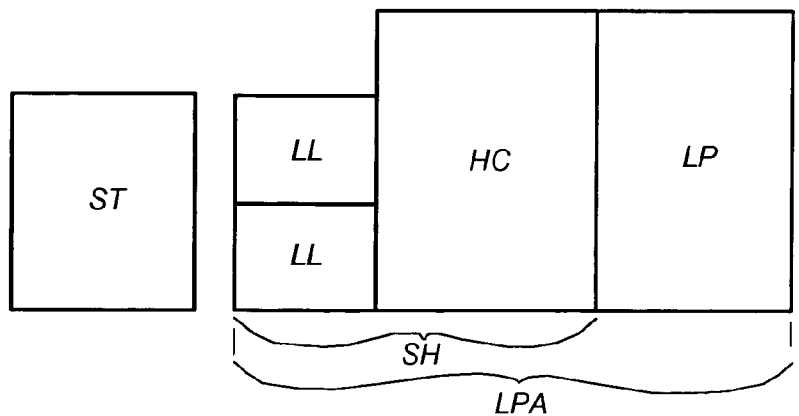
FIG. 2 schematically depicts the general layout of the separate modules of a lithographic projection assembly according to an embodiment of the invention.

FIG. 2 schematically depicts the layout of the separate modules of a lithographic projection assembly LPA according to an embodiment of the invention. This drawing is meant to illustrate the modules, used in this disclosure.

The layout comprises:

two load locks LL: for transferring substrates between a first environment and a second environment. The second environment, prevailing in the modules HC and LP, has a lower pressure than the first environment;

a handler chamber HC: that is provided with pre-processing means, such as pre-alignment means and/or thermal treatment means, for pre-processing of the substrates and transport means for transferring substrates from the load locks LL to the pre-processing means and further from the pre-processing means to a load position in the lithographic projection apparatus LP and in reverse direction from an unload position in the lithographic projection apparatus LP to the load locks LL.

a lithographic projection apparatus LP: as discussed above.

The load locks together with the handler chamber are commonly designated by substrate handler SH or wafer handler in case wafers are being processed.

The lithographic projection apparatus comprises a projection chamber, which comprises, inter alia, the substrate table WT and typically the second positioning means PW from FIG. 1 and evacuating means for evacuating the projection chamber. The functioning of the load locks and handler chamber are described in more detail below.

Figure 3:
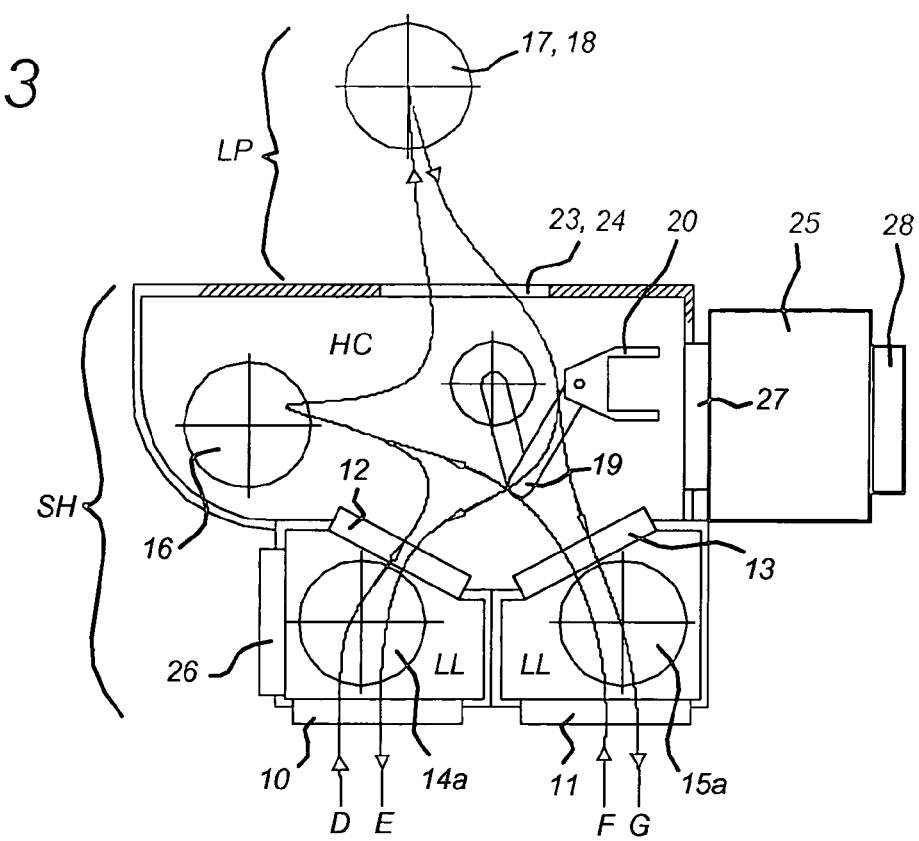
FIG. 3 depicts a lithographic projection assembly according to a first embodiment of the invention.
Figure 4:
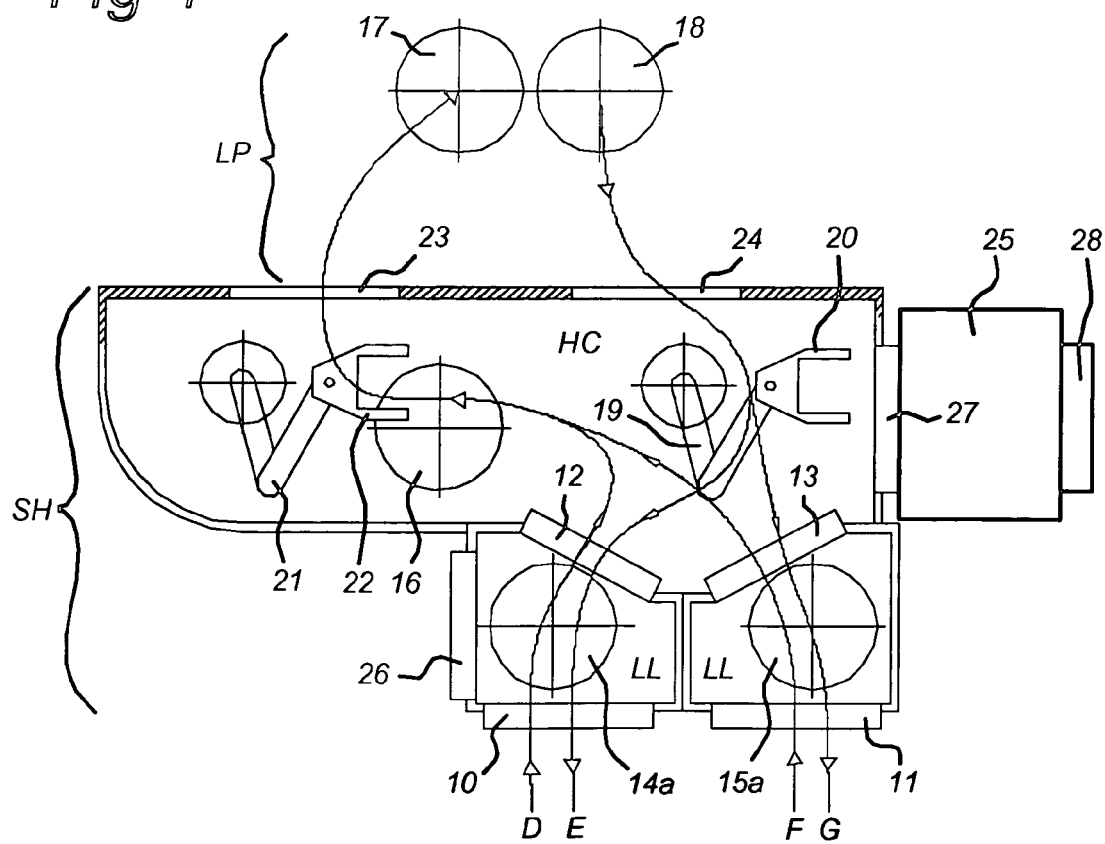
FIG. 4 depicts a lithographic projection assembly according to a second embodiment of the invention.

FIG. 3 and FIG. 4 depict a lithographic projection assembly according to a first and second embodiment, respectively, of the invention. In both Figures the following modules will be recognized:

two load locks LL;

the handler chamber HC, in combination with two load locks LL designated by substrate handler SH or wafer handler;

the lithographic projection apparatus LP, comprising a projection chamber.

In the latter module LP the arrangement is not shown in detail but can be understood by example from FIGS. 1 an 2.

Adjacent to the load locks LL opposite to the handler chamber HC another module will be present such as a substrate track ST (see FIG. 2), that is equipped for supply and removal of substrates to and from the load locks LL.

In each load locks LL a door 10,11 is present, which door is meant for allowing transfer of substrates between the first environment and the load lock LL. At the opposite side thereof, each load lock is provided with a door 12,13 for allowing transfer of substrates between the load lock LL and the handler chamber HC. The second environment will prevail in the handler chamber HC and the lithographic projection apparatus LP during the projection process. Each door 10, 11, 12, 13 is equipped to close off the interior of the respective load lock in a gas-tight manner.

Figure 5:
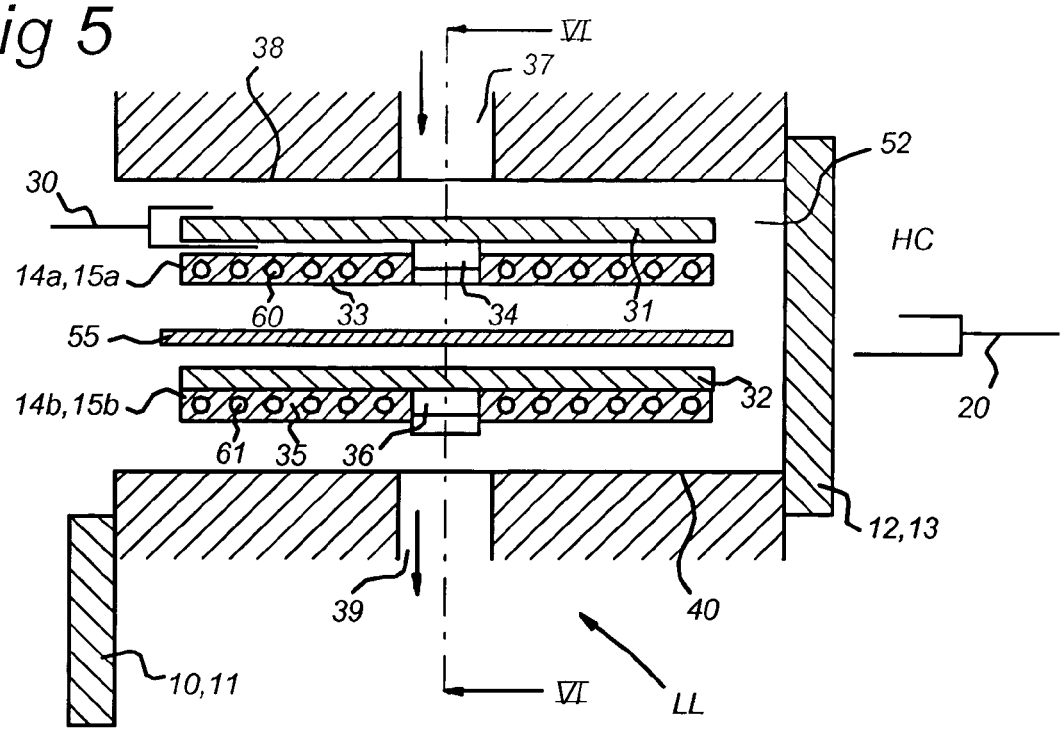
FIG. 5 depicts a cross-section of a load lock according to an embodiment of the invention.
Figure 6:
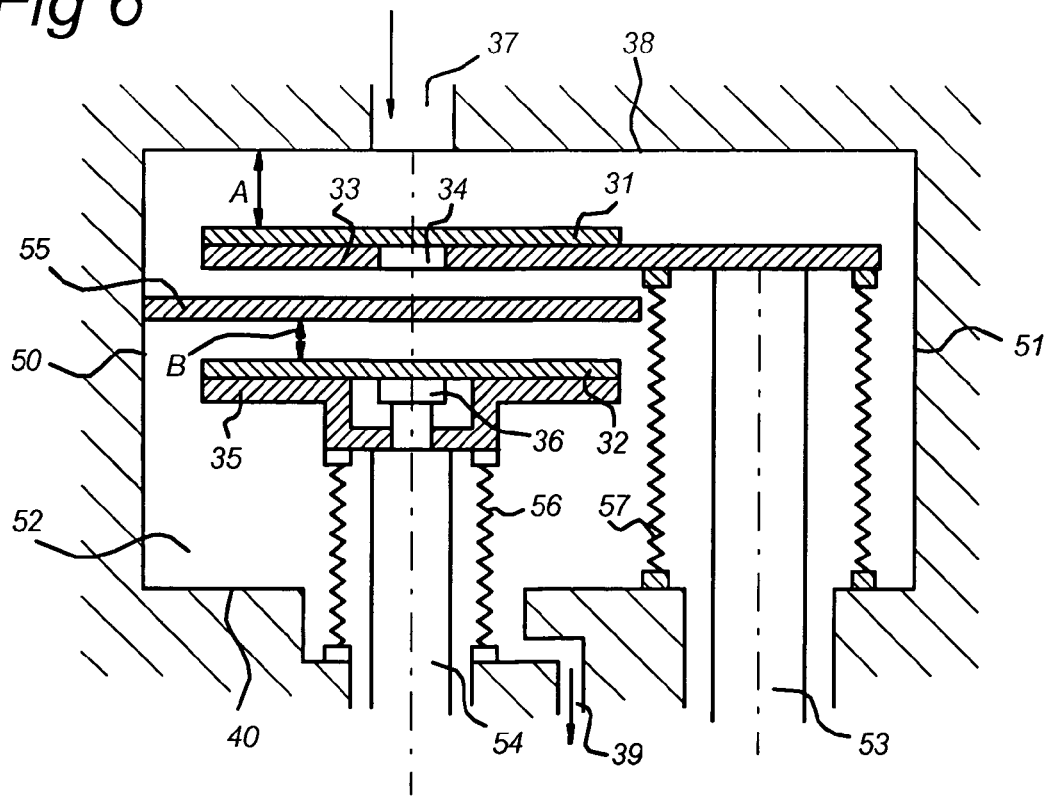
FIG. 6 depicts a cross-section perpendicular to the cross-section of FIG. 5 (line VI—VI) of a load lock according to an embodiment of the invention.

Each load lock has a substrate support position 14a, 15a to support a substrate or a wafer. Not shown in FIG. 4 is a second substrate support position 14b, 15b. The first and second substrate support positions are illustrated in FIGS. 5 and 6 and thus explained hereafter.

The second environment has a lower pressure than the first environment. When the lithographic projection apparatus LP uses extreme ultra-violet (EUV) radiation for example, the second environment will be a vacuum environment. The projection chamber in this case is a vacuum chamber. To establish a vacuum atmosphere the lithographic projection assembly of both embodiments may be provided with vacuum means to establish or maintain a vacuum (not shown).

Alternatively the second environment can also be a special gas environment, such as a nitrogen environment.

In order to transfer substrates between the first environment and a second environment with lower pressure without damaging vital parts due to uncontrolled fierce air flow, just one door of a load lock LL will be opened at a time. Upon transferring from the substrate support position 14a, 15a to the first environment, the load lock LL will be vented first before opening the respective door 10, 11, while upon transferring from the substrate support position 14b, 15b to the second environment the load lock will first be pumped to the required vacuum level before opening the respective door 12, 13.

In the handler chamber HC a pre-processing position 16 is present, where pre-alignment means and thermal treatment means are disposed (not shown). Pre-alignment at the pre-processing position 16 is important in order to reach a required level of accuracy in positioning of the substrate on the wafer table WT. A next position is the load position 17 in the lithographic projection apparatus LP. At this position the substrate is placed on the substrate table WT from FIG. 1. In case wafers are being processed this table is considered a wafer stage. Applying thermal treatment means at this position 16 is advantageous in order to maintain a controlled temperature across the substrate.

In the second embodiment of the invention depicted in FIG. 4, an additional unload position 18 is disposed in the lithographic projection apparatus LP. This in contrast to the first embodiment of FIG. 3 in which both positions 17 and 18 happen to coincide.

Upon transferring substrates between the handler chamber HC and the lithographic projection apparatus LP and vice versa, a substrate passes an entrance 23 or 24. Comparable with the difference in the previous paragraph, in the first embodiment of FIG. 3 the entrance between the handler chamber and load and unload position 23, 24 happen to coincide.

Another difference between the first and second embodiment of FIG. 3 and FIG. 4 relates to the transport means. The first embodiment of FIG. 3 comprises one manipulator 19 having a gripper 20, while the second embodiment depicted in FIG. 4 comprises next to the first manipulator a second manipulator, also having a gripper 22. Both manipulators are in these embodiments a robot, a SCARA robot, but also other robots or other manipulators are conceivable.

The robots are adapted for the following operations:
picking a substrate from one of the load locks LL and transferring said substrate to the pre-processing means 16 and/or;
picking a substrate from the pre-processing means 16 and transferring said substrate to the load position 17; and/or
picking a substrate from the unload position 18 and transferring said substrate to the substrate transport position 14, 15 of one of the load locks LL.

Enhanced throughput of substrates in the first embodiment can be reached by combining two or more of the three operations mentioned above before either venting or pumping down one of the load locks LL.

One will readily understand that the possibilities for combination of the operations mentioned above is drastically enhanced upon using two robots instead of one robot, as is the case in the second embodiment.

Of course other advantageous combinations are possible.

The most logical sequence of transfer operations will depend on the mode of operation of the lithographic projection assembly LPA;
start-up phase: in which no transfer of a substrate from the unload position 18 to load lock LL will be necessary and one or more substrates are transferred into the handler chamber and the lithographic projection apparatus
steady state operation: even transfer to and from the load 17 and unload position 18 respectively
run empty phase: in which no transfer from a load lock LL to the pre-processing position 16 or to a load position occurs and one or more substrates are transferred out of the handler chamber and the lithographic projection apparatus.

According to an embodiment of the invention each load lock LL is provided with a first 14a, 15a and a second substrate support position 14b, 15b (not shown in FIGS. 3 and 4, but shown in FIGS. 5 and 6). An additional support position enhances the possibilities to combine the mentioned three transfer operations, because the second position can act as a kind of buffer for incoming and outgoing substrates.

In both the first and second embodiment the load locks together with the corresponding robots both are formed as a so-called two-way load lock, meaning that each load lock is accessible by both a robot(s) in the handler chamber and a robot(s) from, e.g. the substrate track, in such a way that substrates can be transferred past the doors 10,11,12,13 in both directions. This is indicated by lines D, E, F, G provided with arrow heads in FIGS. 3 and 4. This configuration can enhance the throughput of substrates. Embodiments of the lithographic projection assembly according to the invention, where one load lock is for incoming substrates and the other load lock for outgoing substrates are also feasible. Such an embodiment reduces the flexibility for combination of the three transfer operations, but at the same time reduces the requirements with respect to the operational reach of the robots.

In both embodiments the substrate handler SH is optionally provided with a third load lock 25 for transferring substrates between a third environment and the second environment. On opposite sides of the third load lock 25 two doors 27,28 are provided. Door 27 connects the interior of the third load lock to the handler chamber. External door 28 connects the interior of the third load lock to the environment exterior to the substrate handler.

This third load lock is disposed at a side of the handler chamber that is freely accessible and it enhances the flexibility and application possibilities of the lithographic projection assembly LPA, e.g. by using this third load lock as a buffer in case a substrate should be removed or in case both substrate support positions of the first and second load lock 14a, 14b, 15a, 15b are already taken. Furthermore it can be used to facilitate repair and maintenance of the handler chamber HC and/or the lithographic projection apparatus LP. It is noted that the third environment can be the same as the first environment, but can also be different from the first environment.

In FIGS. 3 and 4 one of the load locks LL comprises an optional external door 26, that is disposed at a side that is freely accessible. This door 26 is meant for transferring substrates or other objects directly from a third environment (which can be the same as the first environment) to the load lock. Furthermore it can be used for repair and maintenance of the corresponding load lock. It is also possible to provide both load locks with an external door 26 or to dispose the external door 26 at the other load lock LL.

FIG. 5 depicts a cross-section of a load lock according to an embodiment of the invention. Several parts in FIG. 5 can be recognised from the previous two figures:
load lock door 10, 11 for connection with the first environment
load lock door 12, 13 for connection with the second environment
a first substrate support position 14a, 15a in the upper part of the load lock
a second substrate support position 14b, 15b in the lower part of the load lock
the gripper 20 from a robot in the handler chamber HC At the left side a gripper 30 is depicted that is equipped to transfer substrates between the load lock and the first environment in, e.g., a substrate track system. This gripper 30, like gripper 20 can pick and deliver substrates to and from the various substrate support positions. In FIG. 5 a substrate 31 has just been placed on the first substrate support position 14a by gripper 30, while a second substrate 32 is supported by the second substrate support position 14b, 15b.

Both substrate support positions 14a, 14b, 15a, 15b comprise a support plate 33, 35 and an ejector pin 34, 36. The ejector pin 34,36 is to facilitate a displacement between a substrate and the support plate 33, 35 so that a part of a gripper can be interposed between the substrate and the support plate, whether in delivering a substrate to a substrate support position or in removing a substrate from a substrate support position. After the gripper 30 has delivered the substrate 31 and is itself moved outside the load lock the ejector pin 34,36 and/or the support plate 33,35 move between themselves in order to let the support plate 33,35 support the substrate, as is the situation for the lower substrate 32 in FIG. 5. Similarly, the ejector pin 34, 36 and/or the support plate 33, 35 can move between themselves in order to allow a part of the gripper 30, 20 to be interposed between the substrate and the support plate so that the gripper picks and transfers the substrate out of the load lock.

In FIG. 5, just one ejector pin 34,36 per support plate is depicted, but in most cases the support plate will have three or more ejector pins. Between support plates 33,35 an intermediate plate 55 is disposed, the function of which will be described later.

With FIG. 5 an advantage of two substrate support positions is easily explained. The load lock LL is vented to the first environment and a first substrate 31 has just been delivered to the first substrate support position 14a, 15a while a second substrate—coming from the handler chamber HC and thus already present before venting the load lock—is supported on the second substrate support position 14b, 15b. From this situation the following operations can take place:

move gripper 30 outside the load lock;

move support plate 33 and/or ejector pin 34 between themselves in order to let the support plate 33 fully support the substrate 31;

move support plate 35 and/or ejector pin 36 between themselves in order to lift the second substrate 32 from the support plate 35;

move gripper 30 or possibly a second gripper (not shown) to the second substrate 32 and subsequently let that gripper grab second substrate 32;

move gripper 30 with second substrate 32 or possibly the second gripper (not shown) outside the load lock (first environment);

close the door 10, 11 and pump down the load lock.

The advantage is that substrates can both be transferred to and from the load lock in between two successive venting and evacuating operations.

One will readily understand that a comparable sequence of operations is possible in order to transfer two substrates between the handler chamber HC and the load lock LL using the gripper 20.

Further in FIG. 5 a top wall 38 comprising a venting opening 37 is depicted on the one hand and a bottom wall 40 comprising a evacuating opening 39 on the other.

The openings 37, 39 are used to supply or pump out gas through the venting and evacuating means. An advantage of this configuration of the venting opening and the evacuating opening is that the gas flow in the load lock is always from top to bottom, which helps to prevent airborne particles from landing on the unsupported surface of the substrate.

Not shown in detail in FIG. 5, but another aspect of the invention, are optional temperature control means integrated with one or more of the support plates in order to stabilise the temperature of the substrates. This means, by way of example, comprises lines 60,61, such as channels, tunnels or tubes, disposed in the interior of a support plate and a fluid pumping system for pumping temperature controlled fluid through the lines. The support plates 33,35 can be subjected to different temperature treatments.

An alternative is to dispose temperature control means in one or more of the walls, e.g. walls 38, 40, 50, 51 and/or doors 10, 11, 12, 13, of the load lock chamber, which will be less effective in stabilising the substrate temperature, but gives a much more simple construction.

FIG. 6 depicts a cross-section according to line VI—VI in FIG. 5 of a load lock according to an embodiment of the invention. Instead of the load lock doors, in this cross-section sidewalls 50 and 51 are depicted. These walls together with bottom wall 40 and top wall 38 define load lock chamber 52. In addition to ejector pins 34,36, support plates 33,35 and venting and evacuating openings 37,39, this embodiments comprises lifting means 53 and/or 54. Bellows 56,57 are used as sealings.

These lifting means firstly function to decrease the distance A, B between the substrates 31 respectively 32 on the one hand and the top wall 38 respectively the intermediate plate 55 on the other hand prior to evacuation of the load lock chamber. Secondly the lifting means function to increase the distance between the support plates 33,35 and the top wall 38 respectively the intermediate plate 55 prior to delivering or picking up a substrate.

As is discussed earlier, an advantageous effect of decreasing the distance A and B is that the volume of gas present around a substrate is reduced. With a reduced volume of gas adiabatic effects during evacuating of the load lock chamber 52 and with that temperature effects on the substrate are also reduced.

In order to avoid any contact between substrates and the top wall or the intermediate plate the distances A and B is more than 100 μm. An additional reason of this is to avoid increase in pumping time, which might arise when too small gaps exists in the load lock chamber.

After evacuating the load lock chamber 52 and opening door 12,13, the distance A, B is increased to establish adequate room for the gripper 20 to pick and remove or deliver a substrate.

Instead of moving the support plates 33,35/substrates 31,32 towards a fixed top wall 38/intermediate plate 55, an alternative is to make use of movable (ceiling) plates (not shown) that are moved towards fixed or movable support plates/substrates. For the first support plate 33 with substrate 31 such a ceiling plate will be disposed at the top wall 38 in which appropriate movement means are disposed, while for the second support plate 35 with substrate 32 the intermediate plate 55 functions as a ceiling plate. For the latter appropriate movement means can be disposed for example in sidewall 50.

In FIG. 6 both substrate support positions 14a, 14b, 15a, 15b are movable. Embodiments where only one of both substrate support positions is movable are also feasible. Such embodiments are especially advantageous when one substrate support position is (for the larger part) reserved for outgoing wafers, for which a close temperature control is less critical. According to a preferred embodiment in this respect, the upper substrate support positions 14a, 15a are movable, whilst the lower substrate support positions 14b, 15b are fixed (i.e., for example, the bellow 56 is superfluous and lifting means 54 can be replaced by a fixed rod). However, it is also feasible, that the upper substrate support positions 14a, 15a are fixed, whilst the lower substrate support positions 14b, 15b are movable.

In an alternative embodiment it is also feasible to integrate the lifting means 53,54 in the walls 50,51.

In the embodiments of FIG. 6 the evacuating opening 39 is integrated in the configuration of the lifting means 54.

It is known to a person skilled in the art that contamination should be minimised in a lithographic projection apparatus LP since contamination particles could block projected light from reaching the radiation-sensitive surface of the substrate W. Also, contamination particles on a backside surface of the substrate W or on a substrate supporting surface of the substrate table WT could cause misalignments of patterns projected onto the substrate W.

Therefore, one or more surfaces in the load locks LL, and in particular surfaces in the load locks LL that are in contact with the substrate W, are advantageously made of a material that has a good affinity for contamination particles, such as organic material. This will cause the contamination particles to stick to the surfaces in the load locks LL, rather than to the substrate W. The collection of contamination particles could also be done with the use of electrostatic forces. For example, the one or more surfaces of the load locks LL may be provided with a charge and the contamination particles provided with an opposite charge so that the contamination particles are attracted to the one or more surfaces.

The load locks LL can be provided with lids to provide cleaning access to the surfaces to which particles are attracted and the surfaces, particularly contact surfaces, can be arranged in such a way that they can easily be removed from the load lock LL, allowing easy cleaning.

Collection of the contamination particles in the load locks LL minimizes the transport of contamination particles from the first to the second environment and vice versa, minimizing, for example, contamination in the handler chamber HC. Moreover, by gathering many particles in the load locks LL, contamination particles reaching the substrate table WT in the lithographic projection apparatus LP, where they can be harmful, can be reduced.

Furthermore, cleaning of the load locks LL is much easier and less time consuming than cleaning the substrate table WT or the handler chamber HC. By collecting particles in the load locks LL, the need to open the handler chamber HC or the lithographic projection apparatus LP, and therefore disturb the vacuum, can be reduced. As a result of this, less time is lost due to the cleaning procedure, since re-establishing a vacuum is time-consuming. Also the risk of contamination as a result of the cleaning procedure is reduced (e.g. fingerprints) since the handler chamber and/or lithographic projection apparatus may be opened less for cleaning.

The load locks LL can also be used to transport so-called sticky wafers to the handler chamber HC and/or the lithographic projection apparatus LP. These sticky wafers are wafer-like objects that have a property for collecting contamination particles (such as remains of resist). One or more of these sticky wafers are cycled through the lithographic projection apparatus LP, handler chamber HC and/or the load locks LL to collect contamination particles. The surface of such a sticky wafer should have a larger affinity for contamination particles than contact surfaces in the lithographic projection apparatus LP, handler chamber HC and/or the load locks LL. A sticky wafer, on which particles are collected, may be transported out of the machine, cleaned and then reinserted into the machine for further cycling.

The collecting property of the sticky wafer could be based on several mechanisms. For example, one mechanism is electrostatic forces. The sticky wafer can be electrostatically charged so as to attract contamination particles. When the wafer is cycled, loose charged particles (including dipoles) will be attracted to the sticky wafer and removed out of the machine, for example, by transporting the sticky wafer out of the machine. Magnetism may also be used for the sticky wafer, as appropriate for the contamination particles.

Another example collecting mechanism can be adhesion and/or cohesion. An adhesive wafer will have a large affinity to contamination particles (such as resist particles). Contamination particles will have a tendency to adhere to the sticky wafer. In case of a cohesive sticky wafer, particles adhering to the sticky wafer will tend to remain on the sticky wafer and not let go onto other surfaces, such as onto clamp surfaces. Advantageously, a sticky wafer would offer both strong adhesion and strong cohesion. Varying levels of adhesion and/or cohesion could be applied to suit the application. Such adhesion and/or cohesion could be provided through, for example, a special adhesive and/or cohesive coating on the wafer or the wafer itself can be made of an adhesive and/or cohesive material.

The use of a sticky wafer as a cleaning device has at least several advantages. For example, a sticky wafer is more effective than a normal wafer. Further, a vacuum in the handler chamber HC and/or the lithographic projection apparatus LP can remain undisturbed while a sticky wafer is cycled through the machine. Re-establishing a vacuum can be time consuming. Further, the risks of contamination due to manual cleaning itself can be reduced, since less manual cleaning of the handler chamber HC, load locks LL and/or the lithographic projection apparatus LP may be required.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic projection assembly, comprising:
   a radiation system configured to provide a beam of radiation;
   a support structure configured to support a patterning device that imparts a desired pattern onto said beam of radiation;
   a substrate holder configured to hold a substrate;
   a first load lock and a second load lock for transferring said substrate between a first environment and a second environment, said second environment configured to have a lower pressure than said first environment;
   a third load lock for transferring objects from a third environment to the second environment, said third load lock being accessible from a side facing the third environment;
   a lithographic projection apparatus comprising a projection chamber in which said substrate is processed by projecting said patterned beam onto a target portion of the substrate; and
   a substrate handler comprising a handler chamber within said second environment, said handler chamber and said projection chamber communicate via a load position for inputting said substrate from said handler chamber into said projection chamber and an unload position for removing said substrate from said projection chamber into said handler chamber, said handler chamber comprising:
   a pre-processing system configured to perform pre-processing tasks on said substrate prior to being processed in said projection chamber, and
   a transport system configured to transfer said substrate from said load locks to said pre-processing system, transfer said substrate from said pre-processing system to said load position, and transfer said substrate from said unload position to said load locks.

2. The lithographic projection assembly according to claim 1, wherein said projection chamber is a vacuum chamber and said lithographic projection apparatus comprises vacuum means for establishing or maintaining a vacuum in the vacuum chamber.

3. The lithographic projection assembly according to claim 1, wherein said pre-processing system comprises a pre-alignment mechanism configured to pre-align said substrate.

4. The lithographic projection assembly according claim 1, wherein said transport system comprises a single manipulator provided with a first gripper and wherein said lithographic projection assembly comprises a control mechanism adapted to control said gripper to (a) pick up said substrate from one of said load locks and transfer to said pre-processing system, (b) to pick up said substrate from said pre-processing system and transfer to said load position, and (c) pick up said substrate from said unload position and transfer to one of said load locks.

5. The lithographic projection assembly claim 4, wherein said control mechanism is adapted to control said load locks independently of each other.

6. The lithographic projection assembly according to claim 1, wherein said transport system comprises a first manipulator provided with a first gripper, and a second manipulator provided with a second gripper, and wherein said lithographic projection assembly comprises a control mechanism adapted to control said first and second manipulators to (a) pick up said substrate with the first gripper from one of said load locks and transfer to said pre-processing system, (b) pick up said substrate with the second gripper from said pre-processing system and transfer to said load position, and (c) pick up said substrate with the first gripper, from said unload position and transfer to one of said load locks.

7. The lithographic projection assembly according to claim 6, wherein at least one of said first and second grippers is provided with a thermal treatment mechanism configured to perform at least one of bringing said substrate to a predetermined temperature, equalizing the temperature across said substrates, and conditioning the temperature of said substrate.

8. The lithographic projection assembly according to claim 6, wherein said first and second load locks and said first or second manipulator is positioned in order to cooperate with said first and second load locks.

9. The lithographic projection assembly according to claim 1, wherein each of said first and second load locks are formed as a two-way load lock.

10. The lithographic projection assembly according to claim 1, wherein each of said first and second load locks are provided with first and second substrate support positions.

11. The lithographic projection assembly according to claim 1, wherein said first and second load locks are connected to a substrate track for supply and removal of substrate to and from said first and second load locks.

12. The lithographic projection assembly according to claim 1, wherein said control mechanism is configured to (a) place said substrate into said third load lock, (b) keep an external door of said third load lock closed while said placed substrate is in said third load lock, and (c) pick up and transfer said placed substrate after having transferred other substrates with said transport mechanism.

13. The lithographic projection assembly claim 1, wherein at least one of first and second load locks comprises a side door for transferring objects from a fourth environment to said second environment, said side door facing the fourth environment and being accessible.

14. The lithographic projection assembly claim 1, wherein said pre-processing system is provided with a thermal treatment mechanism configured to perform at least one of bringing said substrates to a predetermined temperature, equalizing the temperature across said substrates, and conditioning the temperature of said substrates.

15. The lithographic projection assembly claim 1, wherein said substrate comprises a semiconductor wafer.

16. A lithographic substrate handler assembly, comprising:
a first load lock and a second load lock for transferring said substrate between a first environment and a second environment, said second environment configured to have a lower pressure than said first environment;
a third load lock for transferring objects from a third environment to the second environment, said third load lock being accessible from a side facing the third environment; and
a substrate handler comprising a handler chamber within said second environment, said handler chamber and a next station communicate via a load position for inputting said substrate from said handler chamber into said next station and an unload position for removing said substrate from said next station into said handler chamber, said handler chamber comprising:
a pre-processing system configured to perform pre-processing tasks to treat said substrate prior to being processed; and
a transport system configured to transfer said substrate from said load locks to said pre-processing system, transfer said substrate from said pre-processing system to said load position, and transfer said substrate from said unload position to said load looks.

17. The lithographic substrate handler assembly of claim 16, comprising a track and said first load lock and said second load lock being arranged between said track and said substrate handler.

18. A lithographic projection assembly, comprising:
a first and a second load lock for transferring substrates between a first environment and a second environment, said second environment having a lower pressure than said first environment, wherein at least one of said first and second load locks is provided with a first and a second substrate support position;
a third load lock for transferring objects from a third environment to the second environment, said third load lock being accessible from a side facing the third environment;
a substrate handler comprising a handler chamber within said second environment;
a lithographic projection apparatus comprising a projection chamber to process said substrates;
wherein said handler chamber and said projection chamber communicate through a load position for inputting said substrates from said handler chamber into said projection chamber and an unload position for removing said substrates from said projection chamber into said handler chamber; and
wherein said handler chamber is provided with pre-processing system for treating said substrates prior to being processed in said projection chamber and a transport system configured to transfer said substrates from said load locks to said pre-processing system, from said pre-processing system to said load position, and to transfer said substrates from said unload position to said load locks.

* * * * *